(12) United States Patent
Chou et al.

(10) Patent No.: US 7,957,108 B2
(45) Date of Patent: Jun. 7, 2011

(54) MAGNETORESISTIVE ELEMENT HAVING SPACER LAYER THAT INCLUDES TWO LAYERED REGIONS COMPOSED OF OXIDE SEMICONDUCTOR AND NONMAGNETIC CONDUCTOR PHASE SANDWICHED THEREBETWEEN

(75) Inventors: Tsutomu Chou, Toyko (JP); Tomohito Mizuno, Tokyo (JP)

(73) Assignee: TDK Corporation, Tokyo (JP)

( * ) Notice: Subject to any disclaimer, the term of this patent is extended or adjusted under 35 U.S.C. 154(b) by 939 days.

(21) Appl. No.: 11/889,012

(22) Filed: Aug. 8, 2007

(65) Prior Publication Data
US 2009/0040662 A1 Feb. 12, 2009

(51) Int. Cl.
*G11B 5/39* (2006.01)
*H04R 31/00* (2006.01)

(52) U.S. Cl. ............. 360/324.2; 360/324.1; 29/603.07

(58) Field of Classification Search .... 360/324.1–324.2; 365/145, 158, 171–173; 257/421–427; 428/810–816; 29/603.07, 603.13–603.15
See application file for complete search history.

(56) References Cited

U.S. PATENT DOCUMENTS

| 7,072,153 | B2 | 7/2006 | Koui et al. |
| 7,196,877 | B2 | 3/2007 | Yoshikawa et al. |
| 7,218,483 | B2 | 5/2007 | Yuasa et al. |
| 7,423,847 | B2 * | 9/2008 | Carey et al. ............... 360/324.1 |
| 2005/0052787 | A1 | 3/2005 | Funayama et al. |
| 2006/0209472 | A1 | 9/2006 | Koui et al. |

FOREIGN PATENT DOCUMENTS

| JP | A-2003-008102 | 1/2003 |
| JP | A-2003-298143 | 10/2003 |
| JP | A-2004-214234 | 7/2004 |
| JP | A-2005-086112 | 3/2005 |
| JP | A-2006-261306 | 9/2006 |

* cited by examiner

*Primary Examiner* — A. J. Heinz
(74) *Attorney, Agent, or Firm* — Oliff & Berridge, PLC

(57) ABSTRACT

An MR element includes a free layer having a direction of magnetization that changes in response to an external magnetic field, a pinned layer having a fixed direction of magnetization, and a spacer layer disposed between these layers. The spacer layer includes a first region, a second region and a third region that are each in the form of a layer and that are arranged in a direction intersecting the plane of each of the foregoing layers. The second region is sandwiched between the first region and the third region. The first region and the third region are each composed of an oxide semiconductor, and the second region includes at least a nonmagnetic conductor phase.

13 Claims, 8 Drawing Sheets

MAGNETORESISTIVE ELEMENT HAVING SPACER LAYER THAT INCLUDES TWO LAYERED REGIONS COMPOSED OF OXIDE SEMICONDUCTOR AND NONMAGNETIC CONDUCTOR PHASE SANDWICHED THEREBETWEEN

BACKGROUND OF THE INVENTION

1. Field of the Invention

The present invention relates to a magnetoresistive element and a method of manufacturing the same, and to a thin-film magnetic head, a head assembly and a magnetic disk drive each of which includes the magnetoresistive element.

2. Description of the Related Art

Performance improvements in thin-film magnetic heads have been sought as areal recording density of magnetic disk drives has increased. A widely used type of thin-film magnetic head is a composite thin-film magnetic head that has a structure in which a write head having an induction-type electromagnetic transducer for writing and a read head having a magnetoresistive element (that may be hereinafter referred to as MR element) for reading are stacked on a substrate.

MR elements include GMR (giant magnetoresistive) elements utilizing a giant magnetoresistive effect, and TMR (tunneling magnetoresistive) elements utilizing a tunneling magnetoresistive effect.

Read heads are required to have characteristics of high sensitivity and high output. As the read heads that satisfy such requirements, GMR heads that employ spin-valve GMR elements have been mass-produced. Recently, to accommodate further improvements in areal recording density, developments have been pursued for read heads employing TMR elements.

A spin-valve GMR element typically includes a free layer, a pinned layer, a nonmagnetic conductive layer disposed between the free layer and the pinned layer, and an antiferromagnetic layer disposed on a side of the pinned layer farther from the nonmagnetic conductive layer. The free layer is a ferromagnetic layer having a direction of magnetization that changes in response to a signal magnetic field. The pinned layer is a ferromagnetic layer having a fixed direction of magnetization. The antiferromagnetic layer is a layer that fixes the direction of magnetization of the pinned layer by means of exchange coupling with the pinned layer.

Conventional GMR heads have a structure in which a current used for detecting magnetic signals (hereinafter referred to as a sense current) is fed in the direction parallel to the planes of the layers constituting the GMR element. Such a structure is called a CIP (current-in-plane) structure. On the other hand, developments have been pursued for another type of GMR heads having a structure in which the sense current is fed in a direction intersecting the planes of the layers constituting the GMR element, such as the direction perpendicular to the planes of the layers constituting the GMR element. Such a structure is called a CPP (current-perpendicular-to-plane) structure. A GMR element used for read heads having the CPP structure is hereinafter called a CPP-GMR element. A GMR element used for read heads having the CIP structure is hereinafter called a CIP-GMR element.

Read heads that employ TMR elements mentioned above have the CPP structure, too. A TMR element typically includes a free layer, a pinned layer, a tunnel barrier layer disposed between the free layer and the pinned layer, and an antiferromagnetic layer disposed on a side of the pinned layer farther from the tunnel barrier layer. The tunnel barrier layer is a nonmagnetic insulating layer through which spin-conserved conduction electrons are capable of transmitting by the tunnel effect. The free layer, the pinned layer and the antiferromagnetic layer of the TMR element are the same as those of the spin-valve GMR element. As compared with the spin-valve GMR element, the TMR element is expected to provide a higher magnetoresistance change ratio (hereinafter referred to as an MR ratio), which is the ratio of magnetoresistance change with respect to the resistance.

JP 2003-008102A discloses a CPP-GMR element including: a pinned layer whose direction of magnetization is pinned; a free layer whose direction of magnetization changes in response to an external magnetic field; a nonmagnetic metal intermediate layer provided between the pinned layer and the free layer; and a resistance adjustment layer provided between the pinned layer and the free layer and made of a material containing conductive carriers not more than $10^{22}/cm^3$. JP 2003-008102A discloses that the material of the resistance adjustment layer is preferably a semiconductor or a semimetal.

JP 2003-298143A discloses an MR element of the CPP structure including a pinned layer whose direction of magnetization is pinned, a free layer whose direction of magnetization changes in response to an external magnetic field, and an intermediate layer located between the pinned layer and the free layer, wherein the intermediate layer includes a first layer (an intermediate oxide layer) made of an oxide and having a region in which the resistance is relatively high and a region in which the resistance is relatively low, and wherein, when a sense current passes through the first layer, the sense current preferentially flows through the region in which the resistance is relatively low. JP 2003-298143A discloses that the sense current has an ohmic characteristic when passing through the first layer. Therefore, the MR element disclosed in this publication is not a TMR element but a CPP-GMR element. Such a CPP-GMR element is called a current-confined-path type CPP-GMR element, for example. JP 2003-298143A further discloses that the intermediate layer further includes a second layer (an interface adjusting intermediate layer) made of a nonmagnetic metal that is disposed between the first layer and the pinned layer, and between the first layer and the free layer.

JP 2005-086112A also discloses a current-confined-path type CPP-GMR element. This CPP-GMR element includes two nonmagnetic intermediate layers disposed between the free layer and the pinned layer, and a current control layer disposed between the two nonmagnetic intermediate layers. A conductive film made of, e.g., Cu, is used for each of the two nonmagnetic intermediate layers. The current control layer is composed mainly of an insulator that electrically insulates layers disposed on top and bottom of the current control layer from each other, and conductive materials that electrically connect the layers disposed on top and bottom are provided in such a manner as to be scattered in the insulator.

JP 2006-261306A also discloses a current-confined-path type CPP-GMR element. This CPP-GMR element includes an intermediate layer disposed between the pinned layer and the free layer. The intermediate layer includes an insulating film, and a columnar metal conduction portion formed within the insulating film. The CPP-GMR element further includes a compound layer formed between the metal conduction portion and one of the pinned layer and the free layer. The compound layer includes a compound having an ionic binding or covalent binding property. For example, a III-V semiconductor, a II-VI semiconductor or an oxide semiconductor is used as the material of the compound layer.

To use a TMR element for a read head, it is required that the TMR element be reduced in resistance. The reason for this will now be described. Improvements in both recording density and data transfer rate are required of a magnetic disk drive. Accordingly, it is required that the read head exhibit a good high frequency response. However, a TMR element with a high resistance would cause a high stray capacitance in the TMR element and a circuit connected thereto, thereby degrading the high frequency response of the read head. For this reason, it is required that the TMR element be reduced in resistance.

To reduce the resistance of the TMR element, it is typically effective to reduce the thickness of the tunnel barrier layer. However, an excessive reduction in the thickness of the tunnel barrier layer would cause a number of pinholes to develop in the tunnel barrier layer, resulting in a shorter service life of the TMR element. In addition to this, a magnetic coupling may also be established between the free layer and the pinned layer, resulting in deterioration of characteristics of the TMR element such as an increase in noise or a reduction in MR ratio. Here, noise that occurs in read heads is referred to as head noise. Head noise that occurs in a read head employing a TMR element includes shot noise which is a noise component that would not be generated in a read head employing a GMR element. For this reason, a read head employing a TMR element has a problem that it develops greater head noise.

On the other hand, a CPP-GMR element has a problem that it cannot provide a sufficiently high MR ratio. This is presumably because spin-polarized electrons are scattered at the interface between the nonmagnetic conductive layer and a magnetic layer or in the nonmagnetic conductive layer.

Additionally, a CPP-GMR element is low in resistance and is therefore small in resistance change amount. Accordingly, in order to obtain a higher read output with a CPP-GMR element, it is necessary to increase the voltage applied to the element. An increase in the voltage applied to the element would raise the following problem, however. In a CPP-GMR element, a current is fed in the direction perpendicular to the plane of each layer. This causes spin-polarized electrons to be injected from the free layer into the pinned layer or from the pinned layer into the free layer. These spin-polarized electrons generate a torque in the free layer or the pinned layer to rotate the magnetization thereof. In this application this torque is referred to as a spin torque. The spin torque is proportional to the current density. An increase in the voltage applied to the CPP-GMR element causes an increase in current density, thereby resulting in an increase in spin torque. An increase in spin torque results in a problem that the direction of magnetization of the pinned layer fluctuates.

JP 2003-008102A discloses that providing the resistance adjustment layer makes it possible to appropriately adjust the resistance of a CPP element and to thereby increase the resistance change amount so as to enhance the output. However, it is not always possible to increase the MR ratio simply by inserting the resistance adjustment layer between the pinned layer and the free layer. This is because, while the resistance of the MR element increases as the crystal structure of the resistance adjustment layer or a neighborhood thereof is disordered, the disorder of the crystal structure makes spin-polarized electrons scatter noticeably, and as a result, a reduction in MR ratio is caused by spin relaxation.

Current-confined-path type CPP-GMR elements such as those disclosed in, for example, JP 2003-298143A, JP 2005-086112A and JP 2006-261306A are capable of attaining a higher resistance and a greater resistance change amount, compared with a typical CPP-GMR element. However, a typical current-confined-path type CPP-GMR element has a problem as described below. In a typical current-confined-path type CPP-GMR element, the layer for producing the current confining effect is formed through an oxidation treatment, for example. JP 2003-298143A discloses a process of forming the first layer (the intermediate oxide layer) by subjecting a metal layer to an oxidation treatment. JP 2005-086112A discloses a process of forming the current control layer by subjecting a metal to an oxidation, nitriding or oxynitriding treatment. JP 2006-261306A discloses a process of forming a metal path of Cu in an AlCu oxide by forming an AlCu alloy on Cu and then performing an oxidation treatment. In such layers formed through an oxidation treatment, a great change in composition occurs during the process of formation, and the disorder of the crystal structure is thereby enhanced. Consequently, in MR elements including such layers, scattering of spin-polarized electrons occurs noticeably due to the disorder of the crystal structure, and a reduction in MR ratio is caused by spin relaxation.

Thus, it has been conventionally difficult to provide a CPP MR element having such a resistance that suppression of noise and suppression of the effect of spin torque are possible and capable of attaining a high MR ratio.

OBJECT AND SUMMARY OF THE INVENTION

It is an object of the present invention to provide a magnetoresistive element and a method of manufacturing the same, the magnetoresistive element having such a resistance that suppression of noise and suppression of the effect of spin torque are possible and being capable of attaining a high MR ratio, and to provide a thin-film magnetic head, a head assembly and a magnetic disk drive each of which includes the magnetoresistive element.

A magnetoresistive element of the present invention includes: a free layer having a direction of magnetization that changes in response to an external magnetic field; a pinned layer having a fixed direction of magnetization; and a spacer layer disposed between the free layer and the pinned layer, wherein a current for detecting magnetic signals is fed in a direction intersecting the plane of each of the foregoing layers. The spacer layer includes a first, a second, and a third region that are each in the form of a layer and that are arranged in the direction intersecting the plane of each of the foregoing layers. The second region is sandwiched between the first region and the third region. The first region and the third region are each composed of an oxide semiconductor. The second region includes at least a nonmagnetic conductor phase.

In the magnetoresistive element of the invention, the second region may further include an oxide semiconductor phase. A plurality of nonmagnetic conductor phases may be scattered in the oxide semiconductor phase in the second region. In this case, the oxide semiconductor phase and the first and the third region may be all composed of the same material.

In the magnetoresistive element of the invention, the second region may be composed entirely of the nonmagnetic conductor phase.

In the magnetoresistive element of the invention, the second region may have a thickness within a range of 0.1 to 1 nm. The first region and the third region may each have a thickness within a range of 0.1 to 1.4 nm. The spacer layer may have a thickness within a range of 1 to 3 nm.

In the magnetoresistive element of the invention, the proportion of the nonmagnetic conductor phase included in the second region with respect to the entire spacer layer may be within a range of 1 to 50 volume percent.

A method of manufacturing the magnetoresistive element of the present invention includes the steps of forming the pinned layer, forming the spacer layer, and forming the free layer. The step of forming the spacer layer includes the steps of: forming a first oxide semiconductor layer; forming a nonmagnetic conductor layer on the first oxide semiconductor layer; forming a second oxide semiconductor layer on the nonmagnetic conductor layer; and performing heat treatment on the first oxide semiconductor layer, the nonmagnetic conductor layer and the second oxide semiconductor layer so that the first region is formed of the first oxide semiconductor layer, the third region is formed of the second oxide semiconductor layer, and the second region is formed of at least the nonmagnetic conductor layer.

In the method of manufacturing the magnetoresistive element of the invention, the second region may be formed such that a plurality of nonmagnetic conductor phases are scattered in the oxide semiconductor phase as a result of the step of performing heat treatment.

A thin-film magnetic head of the present invention includes: a medium facing surface that faces toward a recording medium; the magnetoresistive element of the invention disposed near the medium facing surface to detect a signal magnetic field sent from the recording medium; and a pair of electrodes for feeding a current for detecting magnetic signals to the magnetoresistive element.

A head assembly of the present invention includes: a slider including the thin-film magnetic head of the invention and disposed to face toward a recording medium; and a supporter flexibly supporting the slider.

A magnetic disk drive of the present invention includes: a slider including the thin-film magnetic head of the invention and disposed to face toward a recording medium that is driven to rotate; and an alignment device supporting the slider and aligning the slider with respect to the recording medium.

According to the present invention, the spacer layer of the magnetoresistive element includes the first region and the third region each composed of an oxide semiconductor, and the second region sandwiched between them. The second region includes at least a nonmagnetic conductor phase. According to the invention, in forming the spacer layer it is not required to form an insulator through an oxidation treatment. Because of these features, the present invention makes it possible to provide a magnetoresistive element having such a resistance that suppression of noise and suppression of the effect of spin torque are possible and capable of attaining a high MR ratio.

In the present invention, the second region may further include an oxide semiconductor phase. A plurality of nonmagnetic conductor phases may be scattered in the oxide semiconductor phase in the second region. In this case, it is possible to attain a higher MR ratio through a current confining effect.

Other and further objects, features and advantages of the invention will appear more fully from the following description.

DETAILED DESCRIPTION OF THE PREFERRED EMBODIMENT

Figure 2:
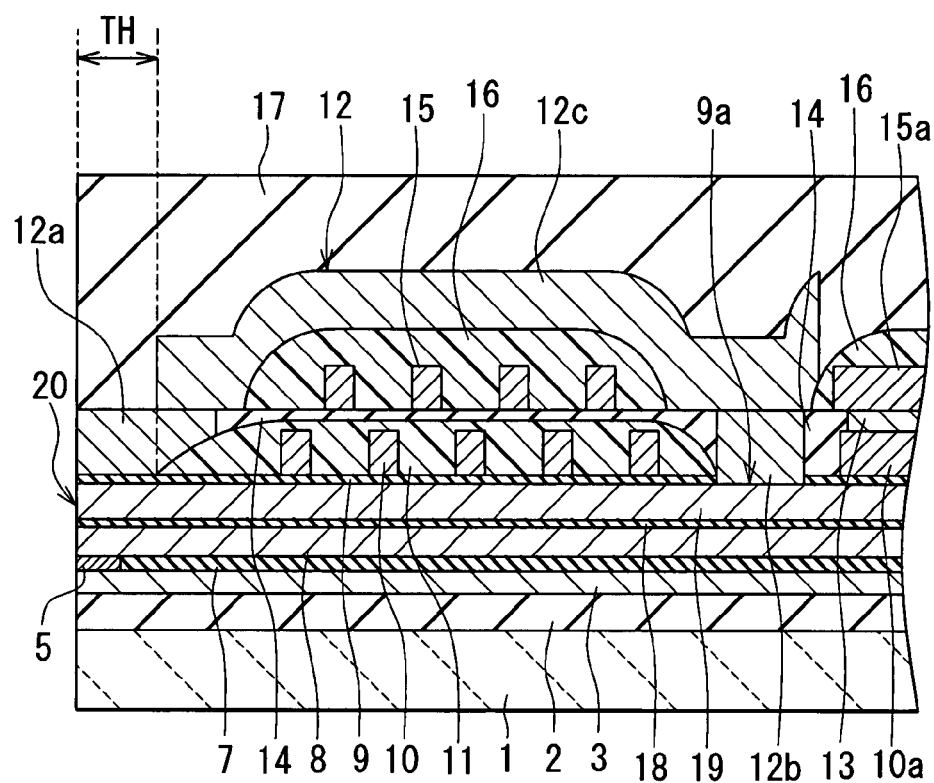
FIG. 2 is a cross-sectional view illustrating a cross section of a thin-film magnetic head of the embodiment of the invention perpendicular to the medium facing surface and the substrate.
Figure 3:
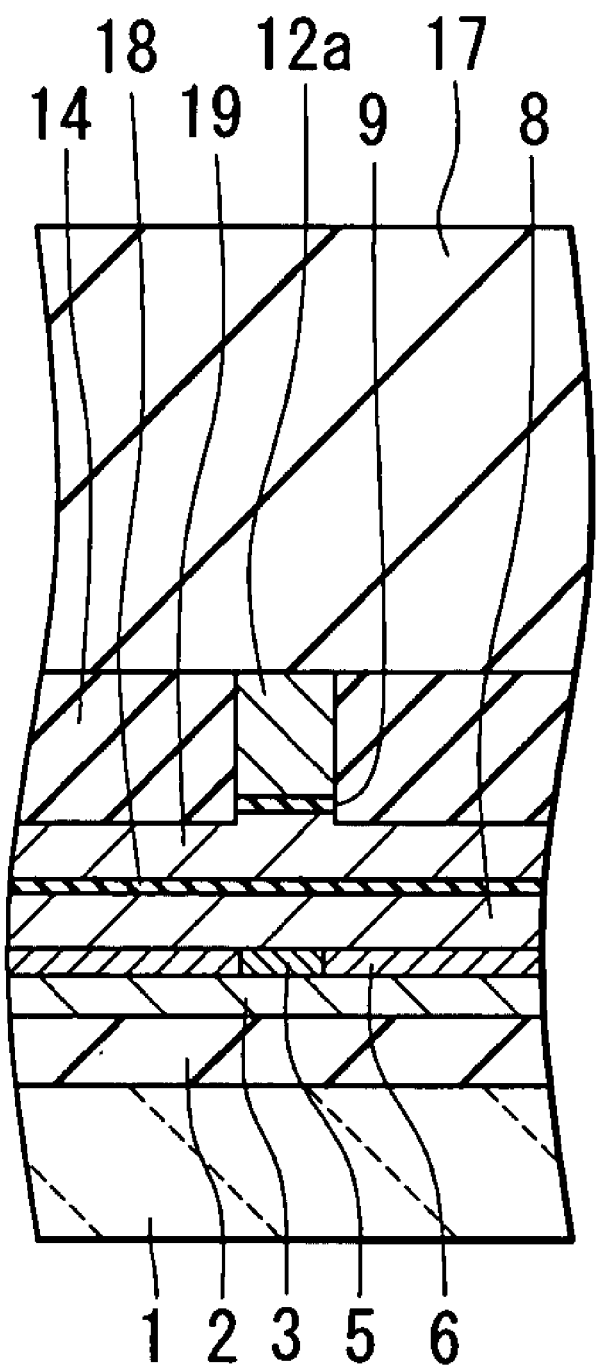
FIG. 3 is a cross-sectional view illustrating a cross section of a pole portion of the thin-film magnetic head of the embodiment of the invention parallel to the medium facing surface.

An embodiment of the present invention will now be described in detail with reference to the drawings. Reference is first made to FIG. 2 and FIG. 3 to describe the outlines of the configuration and a manufacturing method of a thin-film magnetic head of the embodiment of the invention. FIG. 2 is a cross-sectional view illustrating a cross section of the thin-film magnetic head perpendicular to the medium facing surface and the substrate. FIG. 3 is a cross-sectional view illustrating a cross section of a pole portion of the thin-film magnetic head parallel to the medium facing surface.

The thin-film magnetic head of the embodiment has a medium facing surface 20 that faces toward a recording medium. Furthermore, the thin-film magnetic head includes: a substrate 1 made of a ceramic material such as aluminum oxide and titanium carbide ($Al_2O_3$—TiC); an insulating layer 2 made of an insulating material such as alumina ($Al_2O_3$) and disposed on the substrate 1; a first shield layer 3 made of a magnetic material and disposed on the insulating layer 2; an MR element 5 disposed on the first shield layer 3; two bias magnetic field applying layers 6 respectively disposed adjacent to two sides of the MR element 5; and an insulating layer 7 disposed around the MR element 5 and the bias magnetic field applying layers 6. The MR element 5 is disposed near the medium facing surface 20. The insulating layer 7 is made of an insulating material such as alumina.

The thin-film magnetic head further includes: a second shield layer 8 made of a magnetic material and disposed on the MR element 5, the bias magnetic field applying layers 6 and the insulating layer 7; a separating layer 18 made of a nonmagnetic material such as alumina and disposed on the second shield layer 8; and a bottom pole layer 19 made of a magnetic material and disposed on the separating layer 18. The magnetic material used for the second shield layer 8 and the bottom pole layer 19 is a soft magnetic material such as NiFe, CoFe, CoFeB, CoFeNi or FeN. Alternatively, a second shield layer that also functions as a bottom pole layer may be provided in place of the second shield layer 8, the separating layer 18 and the bottom pole layer 19.

The thin-film magnetic head further includes a write gap layer 9 made of a nonmagnetic material such as alumina and disposed on the bottom pole layer 19. A contact hole 9a is formed in a region of the write gap layer 9 away from the medium facing surface 20.

The thin-film magnetic head further includes a first layer portion 10 of a thin-film coil disposed on the write gap layer 9. The first layer portion 10 is made of a conductive material such as copper (Cu). In FIG. 2, numeral 10a indicates a connecting portion of the first layer portion 10 connected to a second layer portion 15 of the thin-film coil to be described later. The first layer portion 10 is wound around the contact hole 9a.

The thin-film magnetic head further includes: an insulating layer 11 made of an insulating material and disposed to cover the first layer portion 10 of the thin-film coil and the write gap layer 9 around the first layer portion 10; a top pole layer 12 made of a magnetic material; and a connecting layer 13 made of a conductive material and disposed on the connecting portion 10a. The connecting layer 13 may be made of a magnetic material. Each of the outer and the inner edge portion of the insulating layer 11 is in the shape of a rounded slope.

The top pole layer 12 includes a track width defining layer 12a, a coupling portion layer 12b and a yoke portion layer 12c. The track width defining layer 12a is disposed on the write gap layer 9 and the insulating layer 11 over a region extending from a sloped portion of the insulating layer 11 closer to the medium facing surface 20 to the medium facing surface 20. The track width defining layer 12a includes: a front-end portion that is formed on the write gap layer 9 and functions as the pole portion of the top pole layer 12; and a connecting portion that is formed on the sloped portion of the insulating layer 11 closer to the medium facing surface 20 and is connected to the yoke portion layer 12c. The front-end portion has a width equal to the write track width. The connecting portion has a width greater than the width of the front-end portion.

The coupling portion layer 12b is disposed on a region of the bottom pole layer 19 where the contact hole 9a is formed. The yoke portion layer 12c couples the track width defining layer 12a and the coupling portion layer 12b to each other. An end of the yoke portion layer 12c that is closer to the medium facing surface 20 is located apart from the medium facing surface 20. The yoke portion layer 12c is connected to the bottom pole layer 19 through the coupling portion layer 12b.

The thin-film magnetic head further includes an insulating layer 14 made of an inorganic insulating material such as alumina and disposed around the coupling portion layer 12b. The track width defining layer 12a, the coupling portion layer 12b, the connecting layer 13 and the insulating layer 14 have flattened top surfaces.

The thin-film magnetic head further includes the second layer portion 15 of the thin-film coil disposed on the insulating layer 14. The second layer portion 15 is made of a conductive material such as copper (Cu). In FIG. 2, numeral 15a indicates a connecting portion of the second layer portion 15 that is connected to the connecting portion 10a of the first layer portion 10 of the thin-film coil through the connecting layer 13. The second layer portion 15 is wound around the coupling portion layer 12b.

The thin-film magnetic head further includes an insulating layer 16 disposed to cover the second layer portion 15 of the thin-film coil and the insulating layer 14 around the second layer portion 15. Each of the outer and the inner edge portion of the insulating layer 16 is in the shape of a rounded slope. Part of the yoke portion layer 12c is disposed on the insulating layer 16.

The thin-film magnetic head further includes an overcoat layer 17 disposed to cover the top pole layer 12. The overcoat layer 17 is made of alumina, for example.

The outline of the manufacturing method of the thin-film magnetic head of the embodiment will now be described. In the manufacturing method of the thin-film magnetic head of the embodiment, first, the insulating layer 2 is formed to have a thickness of 0.2 to 5 µm, for example, on the substrate 1 by sputtering or the like. Next, on the insulating layer 2, the first shield layer 3 is formed into a predetermined pattern by plating or the like. Next, although not shown, an insulating layer made of alumina, for example, is formed over the entire surface. Next, the insulating layer is polished by chemical mechanical polishing (hereinafter referred to as CMP), for example, until the first shield layer 3 is exposed, and the top surfaces of the first shield layer 3 and the insulating layer are thereby flattened.

Next, the MR element 5, the two bias magnetic field applying layers 6 and the insulating layer 7 are formed on the first shield layer 3. Next, the second shield layer 8 is formed on the MR element 5, the bias magnetic field applying layers 6 and the insulating layer 7. The second shield layer 8 is formed by plating or sputtering, for example. Next, the separating layer 18 is formed on the second shield layer 8 by sputtering or the like. Next, the bottom pole layer 19 is formed on the separating layer 18 by plating or sputtering, for example.

Next, the write gap layer 9 is formed to have a thickness of 50 to 300 nm, for example, on the bottom pole layer 19 by sputtering or the like. Next, in order to make a magnetic path, the contact hole 9a is formed by partially etching the write gap layer 9 at a center portion of the thin-film coil that will be formed later.

Next, the first layer portion 10 of the thin-film coil is formed to have a thickness of 2 to 3 µm, for example, on the write gap layer 9. The first layer portion 10 is wound around the contact hole 9a.

Next, the insulating layer 11 is formed into a predetermined pattern to cover the first layer portion 10 of the thin-film coil and the write gap layer 9 disposed around the first layer portion 10. The insulating layer 11 is made of an organic insulating material that exhibits fluidity when heated, such as photoresist. Next, heat treatment is given at a predetermined temperature to flatten the surface of the insulating layer 11. This heat treatment brings each of the outer and the inner edge portion of the insulating layer 11 into the shape of a rounded slope.

Next, the track width defining layer 12a of the top pole layer 12 is formed on the write gap layer 9 and the insulating layer 11 over the region extending from the sloped portion of the insulating layer 11 closer to the medium facing surface 20 described later to the medium facing surface 20.

When the track width defining layer 12a is formed, the coupling portion layer 12b is formed on the region of the bottom pole layer 19 where the contact hole 9a is formed, and the connecting layer 13 is formed on the connecting portion 10a at the same time.

Next, pole trimming is performed. That is, in a region around the track width defining layer 12a, the write gap layer 9 and at least a portion of the pole portion of the bottom pole layer 19 close to the write gap layer 9 are etched using the track width defining layer 12a as a mask. As a result, as shown in FIG. 3, a trim structure is formed, wherein the pole portion of the top pole layer 12, the write gap layer 9 and at least a portion of the pole portion of the bottom pole layer 19 have equal widths. The trim structure makes it possible to prevent an increase in effective track width resulting from an expansion of magnetic flux near the write gap layer 9.

Next, the insulating layer 14 is formed to have a thickness of 3 to 4 μm, for example, over the entire top surface of a stack of the layers that have been formed through the foregoing steps. Next, the insulating layer 14 is polished by CMP, for example, to reach the surfaces of the track width defining layer 12a, the coupling portion layer 12b and the connecting layer 13, and is thereby flattened.

Next, the second layer portion 15 of the thin-film coil is formed to have a thickness of 2 to 3 μm, for example, on the insulating layer 14 that has been flattened. The second layer portion 15 is wound around the coupling portion layer 12b.

Next, the insulating layer 16 is formed into a predetermined pattern to cover the second layer portion 15 of the thin-film coil and the insulating layer 14 disposed around the second layer portion 15. The insulating layer 16 is made of an organic insulating material that exhibits fluidity when heated, such as photoresist. Next, heat treatment is given at a predetermined temperature to flatten the surface of the insulating layer 16. This heat treatment brings each of the outer and the inner edge portion of the insulating layer 16 into the shape of a rounded slope. Next, the yoke portion layer 12c is formed on the track width defining layer 12a, the insulating layers 14 and 16 and the coupling portion layer 12b.

Next, the overcoat layer 17 is formed to cover the entire top surface of a stack of the layers that have been formed through the foregoing steps. Wiring, terminals and so on are then formed on the overcoat layer 17. Finally, machining of the slider including the foregoing layers is performed to form the medium facing surface 20. The thin-film magnetic head including a write head and a read head is thus completed.

The thin-film magnetic head manufactured in this manner has the medium facing surface 20 that faces toward the recording medium, the read head, and the write head. The read head is disposed near the medium facing surface 20 to detect a signal magnetic field sent from the recording medium. The configuration of the read head will be described in detail later.

The write head includes: the bottom pole layer 19 and the top pole layer 12 magnetically coupled to each other and including the respective pole portions that are opposed to each other and placed in regions of the pole layers on a side of the medium facing surface 20; the write gap layer 9 provided between the pole portion of the bottom pole layer 19 and the pole portion of the top pole layer 12; and the thin-film coil 10, 15 at least part of which is placed between the bottom pole layer 19 and the top pole layer 12 and insulated from the bottom pole layer 19 and the top pole layer 12. In this thin-film magnetic head, as illustrated in FIG. 2, the length from the medium facing surface 20 to the end of the insulating layer 11 closer to the medium facing surface 20 corresponds to throat height TH. Note that the throat height refers to a length (height) from the medium facing surface 20 to a point at which the distance between the two pole layers starts to increase. It should be noted that, while FIG. 2 and FIG. 3 illustrate a write head for use with the longitudinal magnetic recording system, the write head of the embodiment can be one for use with the perpendicular magnetic recording system.

Figure 1:
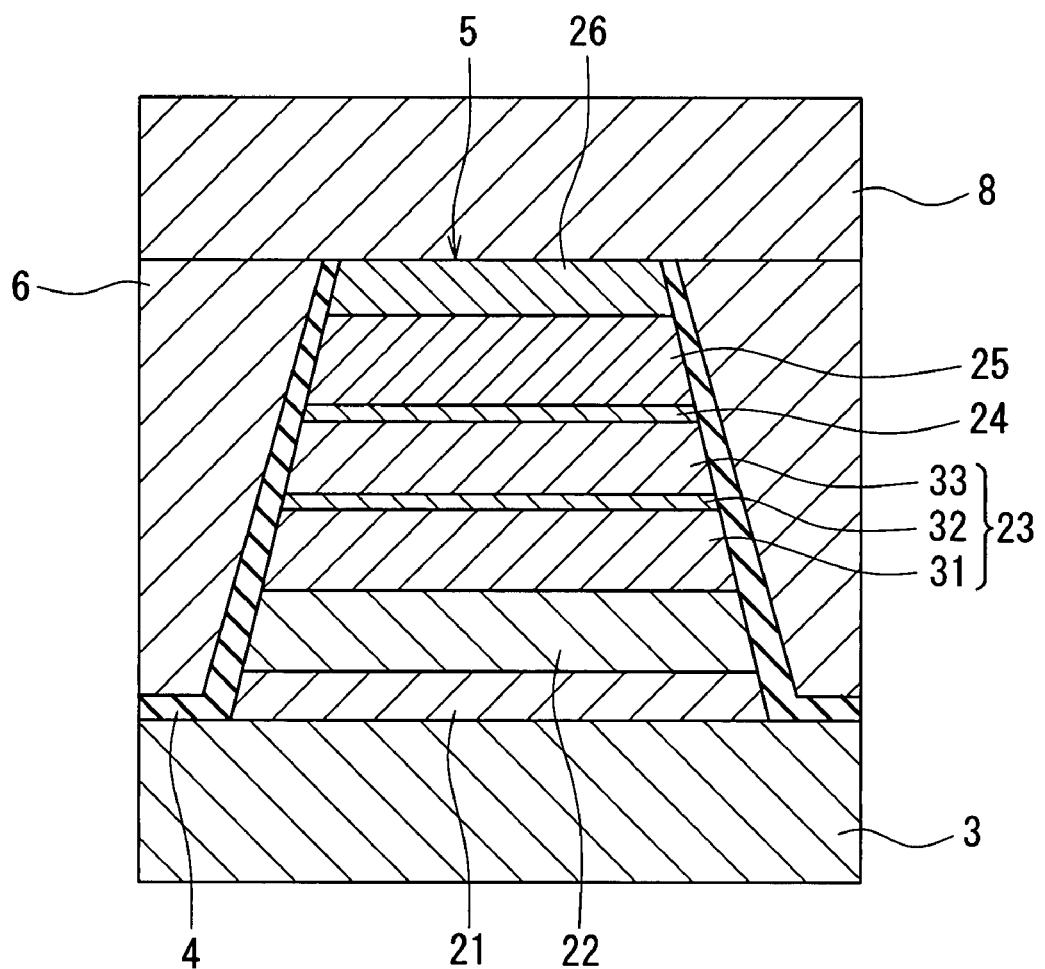
FIG. 1 is a cross-sectional view illustrating a cross section of a read head including an MR element of an embodiment of the invention parallel to the medium facing surface.

Reference is now made to FIG. 1 to describe the configuration of the read head of the embodiment in detail. FIG. 1 is a cross-sectional view illustrating a cross section of the read head parallel to the medium facing surface. As illustrated in FIG. 1, the read head includes the first shield layer 3 and the second shield layer 8 disposed at a specific distance from each other, and the MR element 5 disposed between the first shield layer 3 and the second shield layer 8. The MR element 5 and the second shield layer 8 are stacked on the first shield layer 3.

The read head further includes: the two bias magnetic field applying layers 6 that are respectively disposed adjacent to the two sides of the MR element 5 and that apply a bias magnetic field to the MR element 5; and the insulating layer 4 disposed between the first shield layer 3 and the bias magnetic field applying layers 6 and between the MR element 5 and the bias magnetic field applying layers 6.

The bias magnetic field applying layers 6 are each composed of a hard magnetic layer (hard magnet) or a stack of a ferromagnetic layer and an antiferromagnetic layer, for example. To be specific, the bias magnetic field applying layers 6 are made of CoPt or CoCrPt, for example. The insulating layer 4 is made of alumina, for example.

The MR element 5 of the embodiment is a CPP-GMR element. In this MR element 5, a sense current, which is a current for detecting magnetic signals, is fed in a direction intersecting the planes of layers constituting the MR element 5, such as the direction perpendicular to the planes of layers constituting the MR element 5. The first shield layer 3 and the second shield layer 8 also function as a pair of electrodes for feeding the sense current to the MR element 5 in a direction intersecting the planes of the layers constituting the MR element 5, such as the direction perpendicular to the planes of the layers constituting the MR element 5. Alternatively, besides the first shield layer 3 and the second shield layer 8, there may be provided a pair of electrodes on top and bottom of the MR element 5, respectively. The MR element 5 has a resistance that changes in response to an external magnetic field, that is, a signal magnetic field sent from the recording medium. The resistance of the MR element 5 can be determined from the sense current. It is thus possible to read data stored on the recording medium through the use of the read head.

FIG. 1 illustrates an example of configuration of the MR element 5. This MR element 5 includes: a free layer 25 that is a ferromagnetic layer whose direction of magnetization changes in response to the signal magnetic field; a pinned layer 23 that is a ferromagnetic layer whose direction of magnetization is fixed; and a spacer layer 24 disposed between the free layer 25 and the pinned layer 23. In the example illustrated in FIG. 1, the pinned layer 23 is disposed closer to the first shield layer 3 than is the free layer 25. However, such a configuration is also possible that the free layer 25 is disposed closer to the first shield layer 3 instead. The MR element 5 further includes: an antiferromagnetic layer 22 disposed on a side of the pinned layer 23 farther from the spacer layer 24; an underlying layer 21 disposed between the first shield layer 3 and the antiferromagnetic layer 22; and a protection layer 26 disposed between the free layer 25 and the second shield layer 8. In the MR element 5 illustrated in FIG. 1, the underlying layer 21, the antiferromagnetic layer 22, the pinned layer 23, the spacer layer 24, the free layer 25 and the protection layer 26 are stacked in this order on the first shield layer 3.

The antiferromagnetic layer 22 is a layer for fixing the direction of magnetization of the pinned layer 23 by means of exchange coupling with the pinned layer 23. The underlying layer 21 is provided for improving the crystallinity and orientability of each layer formed thereon and particularly for enhancing the exchange coupling between the antiferromagnetic layer 22 and the pinned layer 23. The protection layer 26 is a layer for protecting the layers located therebelow.

The underlying layer 21 has a thickness of 2 to 6 nm, for example. The underlying layer 21 is formed of a stack of a Ta layer and a Ru layer, for example.

The antiferromagnetic layer 22 has a thickness of 5 to 30 nm, for example. The antiferromagnetic layer 22 is made of an antiferromagnetic material containing Mn and at least one element $M_{II}$ selected from the group consisting of Pt, Ru, Rh, Pd, Ni, Cu, Ir, Cr and Fe, for example. The Mn content of the material is preferably equal to or higher than 35 atomic percent and lower than or equal to 95 atomic percent, while the content of the other element $M_{II}$ of the material is preferably equal to or higher than 5 atomic percent and lower than or equal to 65 atomic percent. There are two types of the antiferromagnetic material, one is a non-heat-induced antiferromagnetic material that exhibits antiferromagnetism without any heat treatment and induces an exchange coupling magnetic field between a ferromagnetic material and itself, and the other is a heat-induced antiferromagnetic material that exhibits antiferromagnetism by undergoing heat treatment. The antiferromagnetic layer 22 can be made of either of these types. Examples of the non-heat-induced antiferromagnetic material include a Mn alloy that has a γ phase, such as RuRhMn, FeMn, or IrMn. Examples of the heat-induced antiferromagnetic material include a Mn alloy that has a regular crystal structure, such as PtMn, NiMn, or PtRhMn.

As a layer for fixing the direction of magnetization of the pinned layer 23, a hard magnetic layer made of a hard magnetic material such as CoPt may be provided in place of the antiferromagnetic layer 22 described above. In this case, for example, Cr, CrTi or TiW is used as the material of the underlying layer 21.

In the pinned layer 23, the direction of magnetization is fixed by exchange coupling with the antiferromagnetic layer 22 at the interface between the antiferromagnetic layer 22 and the pinned layer 23. The pinned layer 23 of the embodiment is a so-called synthetic pinned layer, having an outer layer 31, a nonmagnetic middle layer 32 and an inner layer 33 that are stacked in this order on the antiferromagnetic layer 22. Each of the outer layer 31 and the inner layer 33 includes a ferromagnetic layer made of a ferromagnetic material containing at least Co selected from the group consisting of Co and Fe, for example. The outer layer 31 and the inner layer 33 are antiferromagnetic-coupled to each other and the magnetizations thereof are fixed to opposite directions. The outer layer 31 has a thickness of 3 to 7 nm, for example. The inner layer 33 has a thickness of 3 to 10 nm, for example.

The nonmagnetic middle layer 32 has a thickness of 0.35 to 1.0 nm, for example. The nonmagnetic middle layer 32 is made of a nonmagnetic material containing at least one element selected from the group consisting of Ru, Rh, Ir, Re, Cr, Zr and Cu, for example. The nonmagnetic middle layer 32 is provided for producing antiferromagnetic exchange coupling between the inner layer 33 and the outer layer 31, and for fixing the magnetizations of the inner layer 33 and the outer layer 31 to opposite directions. Note that the magnetizations of the inner layer 33 and the outer layer 31 in opposite directions include not only the case in which there is a difference of 180 degrees between these directions of magnetizations, but also the case in which there is a difference of 180±20 degrees between them.

The free layer 25 has a thickness of 2 to 10 nm, for example. The free layer 25 is formed of a ferromagnetic layer having a low coercivity. The free layer 25 may include a plurality of ferromagnetic layers stacked.

The protection layer 26 has a thickness of 0.5 to 20 nm, for example. The protection layer 26 may be formed of a Ta layer or a Ru layer, for example. The protection layer 26 may be formed into a two-layer structure made up of a combination of a Ta layer and a Ru layer, for example, or a three-layer structure made up of a combination of Ta, Ru and Ta layers or a combination of Ru, Ta and Ru layers, for example.

At least one of the inner layer 33 and the free layer 25 may include an alloy layer having a spin polarization nearly equal to 1, such as a Heusler alloy layer.

For the MR element 5 to operate properly as a CPP-GMR element, there is an appropriate range for the resistance-area product (RA) of the MR element 5. That is, if the resistance-area product of the MR element 5 is too small, the resistance of the MR element 5 is made too low, and as a result, the resistance change amount of the MR element 5 is reduced and this causes a reduction in read output voltage. In addition, it is required that the resistance change amount of the MR element 5 be greater than a parasitic resistance created by, for example, a lead wire for feeding a sense current to the MR element 5. On the other hand, if the resistance-area product of the MR element 5 is too great, the resistance of the MR element 5 is made too high and noise increases. In consideration of the foregoing, the resistance-area product of the MR element 5 should preferably be within a range of 0.1 to 0.3 $\Omega \cdot \mu m^2$, and more preferably within a range of 0.12 to 0.25 $\Omega \cdot \mu m^2$.

Figure 8:
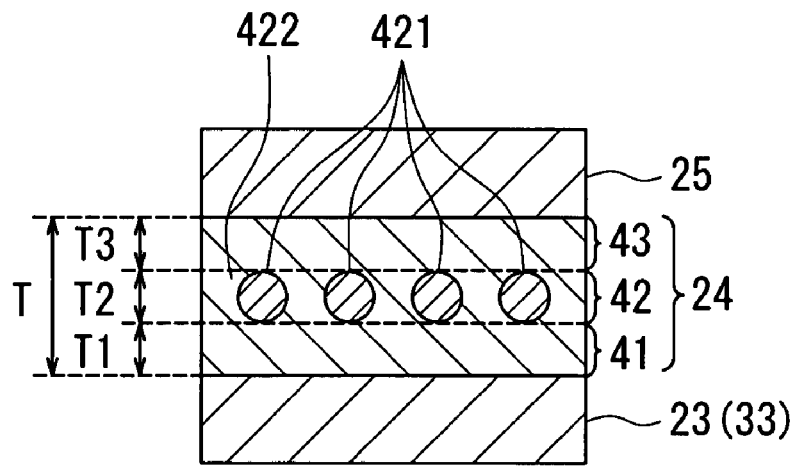
FIG. 8 is an explanatory view illustrating a first mode of a spacer layer of the MR element of the embodiment of the invention.
Figure 9:
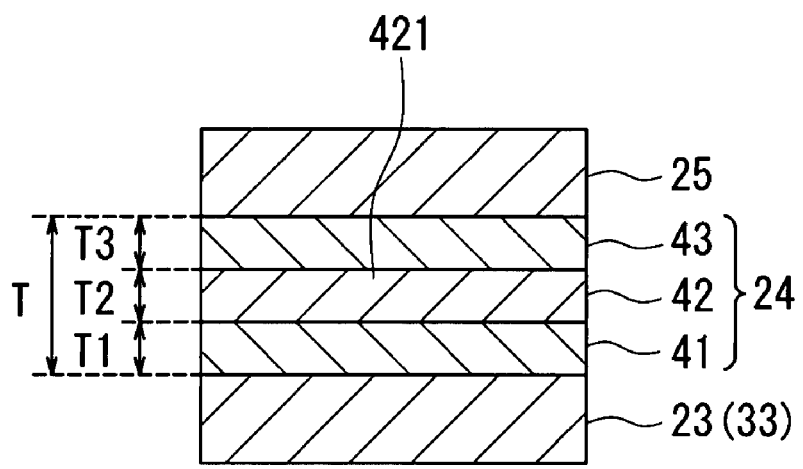
FIG. 9 is an explanatory view illustrating a second mode of the spacer layer of the MR element of the embodiment of the invention.

Reference is now made to FIG. 8 and FIG. 9 to describe the spacer layer 24 of the embodiment in detail. The spacer layer 24 of the embodiment has a first mode shown in FIG. 8 and a second mode shown in FIG. 9. FIG. 8 and FIG. 9 each schematically illustrate the pinned layer 23 (the inner layer 33), the spacer layer 24 and the free layer 25 of the embodiment. As shown in FIG. 8 and FIG. 9, the spacer layer 24 includes a first region 41, a second region 42 and a third region 43 that are each in the form of a layer and that are arranged in a direction intersecting the plane of each layer of the MR element 5. The second region 42 is sandwiched between the first region 41 and the third region 43. The first region 41 and the third region 43 are each composed of an oxide semiconductor. The second region 42 includes at least a nonmagnetic conductor phase. The second region 42 may further include an oxide semiconductor phase. The first region 41 is adjacent to the pinned layer 23 (the inner layer 33) while the third region 43 is adjacent to the free layer 25.

In the first mode shown in FIG. 8, the second region 42 is such that a plurality of nonmagnetic conductor phases 421 are scattered in the oxide semiconductor phase 422. In this case, the oxide semiconductor phase 422, the first region 41 and the third region 43 may be all composed of the same material. FIG. 8 illustrates the case in which the oxide semiconductor phase 422, the first region 41 and the third region 43 are all composed of the same material.

In the second mode shown in FIG. 9, the second region 42 is composed entirely of the nonmagnetic conductor phase 421. In this case, the first region 41 and the third region 43 may be composed of the same material.

The oxide semiconductor used to form the first region 41, the third region 43 and the oxide semiconductor phase 422 can be any of zinc oxide (ZnO), titanium oxide (TiO), tin oxide (SnO) and indium oxide (InO), for example. Furthermore, the oxide semiconductor used to form the first region 41, the third region 43 and the oxide semiconductor phase 422 may have an oxygen defect of 1 percent or lower, for example. In the case where an oxide semiconductor has an oxygen defect, electrons exist in the Fermi level of the oxide semiconductor, and the resistance of the oxide semiconductor is therefore low. An oxide semiconductor having an oxygen defect is therefore suitable to be used for the spacer layer of a CPP-GMR element.

The nonmagnetic conductor phase 421 is composed of a nonmagnetic conductive material. The nonmagnetic conductive material can be any of Cu, Au, Ag, Ru, Pd, Rh, Re, Ir, Sn, Zn, Ti, In, and $Cu_2O$, for example.

In the embodiment, a nonmagnetic metal layer smaller than 1 nm in thickness may be provided between the spacer layer 24 and each of the magnetic layers adjacent thereto, that is, to be specific, between the first region 41 and the inner layer 33, and between the third region 43 and the free layer 25. This nonmagnetic metal layer is provided for suppressing degradation of the characteristics of the MR element 5 due to oxidation of the magnetic layers (the inner layer 33 and the free layer 25) and for relieving the lattice misfit at the interface between the magnetic layer and the first region 41 or the third region 43 composed of an oxide semiconductor. The material of the nonmagnetic metal layer can be any of those listed as examples of the nonmagnetic conductive material to be used for the nonmagnetic conductor phase 421.

A method of manufacturing the read head of FIG. 1 will now be described. In the method of manufacturing this read head, first, the first shield layer 3 having a predetermined pattern is formed on the insulating layer 2 by plating or the like. Next, on the first shield layer 3, films to be the respective layers constituting the MR element 5 are formed one by one by sputtering, for example, to thereby form a stack of these films. Next, the stack is patterned by etching to thereby form the MR element 5. Next, the insulating layer 4 and the bias magnetic field applying layers 6 are formed in this order by sputtering, for example. Next, the second shield layer 8 is formed by plating or sputtering, for example, on the MR element 5 and the bias magnetic field applying layers 6.

The method of manufacturing the MR element 5 of the embodiment includes the steps of forming the underlying layer 21, the antiferromagnetic layer 22, the pinned layer 23, the spacer layer 24, the free layer 25 and the protection layer 26 that constitute the MR element 5. The step of forming the spacer layer 24 includes the steps of: forming a first oxide semiconductor layer; forming a nonmagnetic conductor layer on the first oxide semiconductor layer; forming a second oxide semiconductor layer on the nonmagnetic conductor layer; and performing heat treatment on the first oxide semiconductor layer, the nonmagnetic conductor layer and the second oxide semiconductor layer so that the first region 41 is formed of the first oxide semiconductor layer, the third region 43 is formed of the second oxide semiconductor layer, and the second region 42 is formed of at least the nonmagnetic conductor layer.

The material of the first oxide semiconductor layer is the same as the material of the first region 41, and the material of the second oxide semiconductor layer is the same as the material of the third region 43. The material of the nonmagnetic conductor layer is the same as the material of the nonmagnetic conductor phase 421 of the second region 42.

The foregoing heat treatment is performed for the purpose of reducing the disorder of the crystal structure of the nonmagnetic conductor phase 421. By reducing the disorder of the crystal structure of the nonmagnetic conductor phase 421 through the heat treatment, it is possible to suppress spin relaxation in the nonmagnetic conductor phase 421. The foregoing heat treatment can be performed at any point after forming the layers constituting the spacer layer 24. For example, the heat treatment may be performed at a point after the layers constituting the spacer layer 24 are formed and before the films constituting the free layer 25 are formed, or at a point after the stack of the films to be the respective layers constituting the MR element 5 is formed and before or after this stack is patterned. The temperature of the heat treatment is preferably within a range of 250° C. to 290° C.

By performing the foregoing heat treatment after forming the layers constituting the spacer layer 24, the spacer layer 24 of the first mode shown in FIG. 8 or the spacer layer 24 of the second mode shown in FIG. 9 is formed. The smaller the thickness of the nonmagnetic conductor layer, the likelier it is that the spacer layer 24 of the first mode is formed. The greater the thickness of the nonmagnetic conductor layer, the likelier it is that the spacer layer 24 of the second mode is formed. In the case where the spacer layer 24 of the first mode is formed, through the foregoing heat treatment, the nonmagnetic conductor layer aggregates into the form of islands to thereby form a plurality of nonmagnetic conductor phases 421, while the oxide semiconductor phase 422 is formed of at least one of the first oxide semiconductor layer and the second oxide semiconductor layer.

The operation of the thin-film magnetic head of the embodiment will now be described. The thin-film magnetic head writes data on a recording medium by using the write head and reads data written on the recording medium by using the read head.

In the read head, the direction of the bias magnetic field produced by the bias magnetic field applying layers 6 intersects the direction perpendicular to the medium facing surface 20 at a right angle. In the MR element 5, when no signal magnetic field is present, the direction of magnetization of the free layer 25 is aligned with the direction of the bias magnetic field. On the other hand, the direction of magnetization of the pinned layer 23 is fixed to the direction perpendicular to the medium facing surface 20.

In the MR element 5, the direction of magnetization of the free layer 25 changes in response to the signal magnetic field sent from the recording medium. This causes a change in the relative angle between the direction of magnetization of the free layer 25 and the direction of magnetization of the pinned layer 23, and as a result, the resistance of the MR element 5 changes. The resistance of the MR element 5 can be determined from the potential difference between the first and second shield layers 3 and 8 produced when a sense current is fed to the MR element 5 from the shield layers 3 and 8. Thus, it is possible for the read head to read data stored on the recording medium.

In the MR element 5 of the embodiment, the spacer layer 24 includes the first region 41, the second region 42 and the third region 43 that are each in the form of a layer and that are arranged in a direction intersecting the plane of each layer of the MR element 5. The second region 42 is sandwiched between the first region 41 and the third region 43. The first region 41 and the third region 43 are each composed of an oxide semiconductor. The second region 42 includes at least the nonmagnetic conductor phase 421. The second region 42 may further include the oxide semiconductor phase 422. In the first mode shown in FIG. 8, the second region 42 is such that a plurality of nonmagnetic conductor phases 421 are scattered in the oxide semiconductor phase 422. In the second mode shown in FIG. 9, the second region 42 is composed entirely of the nonmagnetic conductor phase 421.

The MR element 5 of the embodiment is not a TMR element but a CPP-GMR element. According to the MR element 5 of the embodiment, it is therefore possible to reduce the resistance and suppress noise, as compared with a TMR element.

The spacer layer 24 of the MR element 5 of the embodiment has the first region 41 and the third region 43 each composed of an oxide semiconductor. According to the MR element 5 of the embodiment, it is therefore possible to make the resistance greater as compared with a typical CPP-GMR element having a spacer layer composed entirely of a nonmagnetic conductor layer. As a result, according to the embodiment, it is possible to suppress the effect of spin torque.

In the case of an MR element having a spacer layer composed entirely of an oxide semiconductor, the resistance may become too high for a CPP-GMR element and noise may be increased. In contrast, according to the embodiment, the spacer layer 24 includes the nonmagnetic conductor phase 421 sandwiched between the first region 41 and the third region 43 each composed of an oxide semiconductor. Accordingly, the MR element 5 of the embodiment is capable of attaining a lower resistance and suppressing noise, as compared with an MR element having a spacer layer composed entirely of an oxide semiconductor.

In the embodiment, when the second region 42 is of the first mode shown in FIG. 8, a sense current flows preferentially through the nonmagnetic conductor phases 421 in the second region 42. In this case, the MR element 5 can provide a higher MR ratio by the current confining effect.

In a conventional typical current-confined-path type CPP-GMR element, the layer for producing the current confining effect has such a structure that a plurality of conductor portions are scattered in an insulator. Such a layer is formed through an oxidation treatment, for example. In this case, in the layer for producing the current confining effect, a great change in composition occurs during the process of its formation, and the disorder of the crystal structure is thereby enhanced. Consequently, in an MR element including such a layer, scattering of spin-polarized electrons occurs noticeably due to the disorder of the crystal structure, and a reduction in MR ratio is caused by spin relaxation. In contrast, according to the embodiment, it is not required to form an insulator through an oxidation treatment to form the spacer layer 24. Therefore, in the spacer layer 24 of the MR element 5 of the embodiment, no great change in composition occurs during the process of its formation, and no great disorder of the crystal structure occurs, accordingly. Thus, the MR element 5 of the embodiment is capable of suppressing a reduction in MR ratio caused by spin relaxation resulting from a disorder of the crystal structure. Furthermore, according to the MR element 5 of the embodiment, it is possible to allow a large current, such as a current having a current density of approximately $10^8$ A/cm$^2$ or higher, to pass through the spacer layer 24 while maintaining the spin. Because of the foregoing, the MR element 5 of the embodiment is capable of attaining a high MR ratio.

In the embodiment, a lattice misfit occurs at the interface between the magnetic layer and the first region 41 or the third region 43 composed of an oxide semiconductor. As a result, scattering of spin-polarized electrons can occur at this interface. Here, in the case where the second region 42 is of the first mode shown in FIG. 8, a sense current flows preferentially through the nonmagnetic conductor phases 421 in the second region 42. Consequently, at the interface between the magnetic layer and the first region 41 or the third region 43, the sense current passes preferentially through a region near the nonmagnetic conductor phases 421. As a result, the rate at which spin-polarized electrons pass through a disordered structure that may cause scattering is lower, compared with a case where the sense current passes uniformly through the foregoing interface. Therefore, in the case where the second region 42 is of the first mode shown in FIG. 8, it is possible to more greatly suppress a reduction in MR ratio resulting from spin relaxation.

From the foregoing, according to the embodiment, it is possible to provide the MR element 5 having such a resistance that suppression of noise and suppression of the effect of spin torque are possible and capable of attaining a high MR ratio.

It is necessary for the spacer layer 24 to have such a thickness that no exchange coupling occurs between the pinned layer 23 and the free layer 25. As the spin relaxation in the spacer layer 24 is reduced, the effect as a spin filter is enhanced and therefore the MR ratio of the MR element 5 can increase. If the thickness T of the spacer layer 24 is too great, the spin relaxation in the spacer layer 24 increases to cause a reduction in MR ratio. On the other hand, if the thickness T of the spacer layer 24 is too small, an exchange coupling can occur between the pinned layer 23 and the free layer 25, so that the spacer layer 24 will become unable to perform its function. In consideration of the foregoing, the thickness T of the spacer layer 24 should preferably be within a range of 1 to 3 nm, and more preferably within a range of 1.2 to 2 nm.

There is an appropriate range for the thickness T2 of the second region 42 for effectively obtaining the effect of the presence of the second region 42. That is, if T2 is too great, the resistance of the MR element 5 becomes lower and the MR ratio decreases. On the other hand, if T2 is too small, the effect of inserting the nonmagnetic conductor phase 421 between the first region 41 and the third region 43 is less exhibited, and the MR ratio decreases because the rate at which spin-polarized electrons pass through a disordered structure that may cause scattering is increased. In consideration of the foregoing, the thickness T2 of the second region 42 should preferably be within a range of 0.1 to 1 nm, and more preferably within a range of 0.2 to 0.8 nm.

There is also an appropriate range for each of the thickness T1 of the first region 41 and the thickness T3 of the third region 43. That is, if T1 and T3 are too great, the resistance-area product of the MR element 5 becomes too great, and as a result, the resistance of the MR element 5 becomes too high. On the other hand, if T1 and T3 are too small, the disorder of the crystal structure near the interface between the magnetic layer and the first region 41 or the third region 43 is enhanced and the MR ratio decreases due to spin relaxation. In consideration of the foregoing, each of the thickness T1 of the first region 41 and the thickness T3 of the third region 43 should preferably be within a range of 0.1 to 1.4 nm.

There is also an appropriate range for the proportion of the nonmagnetic conductor phase 421 included in the second region 42 with respect to the entire spacer layer 24. That is, if the proportion of the nonmagnetic conductor phase 421 is too low, the resistance of the MR element 5 becomes too high. If the proportion of the nonmagnetic conductor phase 421 is too high, the resistance of the MR element 5 becomes too low. Therefore, neither case conforms to the conditions under which the MR element 5 can operate properly as a CPP-GMR element. In consideration of the foregoing, the proportion of the nonmagnetic conductor phase 421 included in the second region 42 with respect to the entire spacer layer 24 should preferably be within a range of 1 to 50 volume percent, and more preferably within a range of 3 to 30 volume percent.

The shapes and compositions of the components of the spacer layer 24 can be confirmed by observing a cross section of the spacer layer 24 with a transmission electron microscope (TEM) and by analyzing the composition of the spacer layer 24 by electron energy-loss spectroscopy (EELS). It is thereby possible to confirm the mode of the spacer layer 24, too.

Descriptions will now be made on the results of an experiment that indicate the effects of the embodiment. In this experiment, 12 types of MR element samples numbered 1 to 12 were prepared, and then the resistance-area product ($\Omega \cdot \mu m^2$), the MR ratio (%), the head noise ($\mu Vrms/\sqrt{Hz}$), the current density (A/cm$^2$), and the exchange coupling magnetic field (Oe) of the pinned layer 23 were determined for these samples (MR elements). Note that 1 Oe is equal to 79.6 A/m. For the current density, the value thereof was obtained by setting the voltage applied to the MR element to 100 mV.

The film configuration of each of the samples 1 to 7 is the same as that of the MR element 5 of the embodiment shown in FIG. 1. The spacer layer 24 of each of the samples 1 to 7 has the first to third regions 41 to 43. Hereinafter, samples in which the second region 42 is of the first mode shown in FIG. 8 are called Type (1) samples, while samples in which the second region 42 is of the second mode shown in FIG. 9 are called Type (2) samples. The samples 1 to 4 are Type (1) samples, while the samples 5 to 7 are Type (2) samples. In the samples 1 to 7, the first region 41 and the third region 43 are each composed of ZnO as an oxide semiconductor. In the samples 1 to 4, the nonmagnetic conductor phases 421 are composed of Cu while the oxide semiconductor phase 422 is composed of ZnO. In the samples 5 to 7, the second region 42, i.e., the nonmagnetic conductor phase 421, is composed of Cu. Each of the samples 1 to 7 corresponds to an example of the MR element 5 of the embodiment. The specific film configuration of the samples 1 to 7 is shown in Table 1 below.

TABLE 1

| Layer | | Substance | Thickness (nm) |
|---|---|---|---|
| Protection layer | | Ta | 2 |
| | | Ru | 13 |
| Free layer | | CoFe | 4 |
| Spacer layer | | ZnO and Cu | T |
| Pinned layer | Inner layer | CoFe | 5.5 |
| | Nonmagnetic middle layer | Ru | 0.8 |
| | Outer layer | CoFe | 5 |
| Antiferromagnetic layer | | IrMn | 5.5 |
| Underlying layer | | Ru | 2 |
| | | Ta | 1 |

Figure 10:
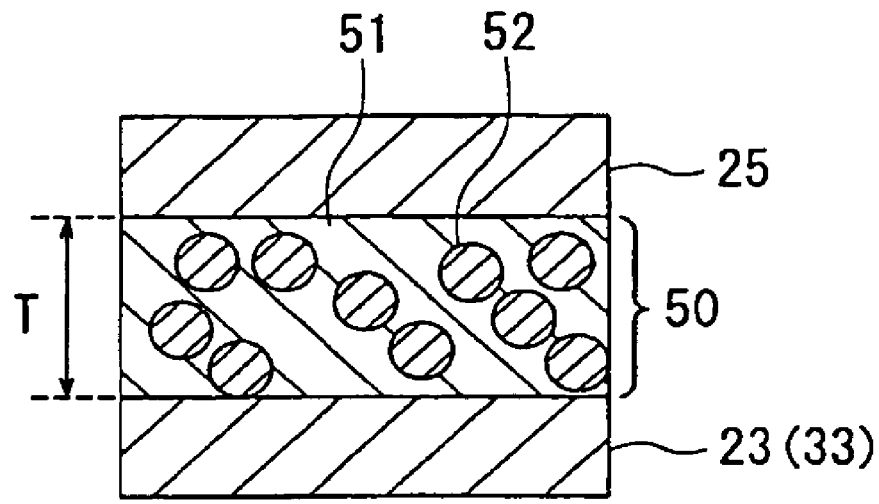
FIG. 10 is an explanatory view illustrating a spacer layer of an MR element of a first comparative example.

The samples 8 to 12 correspond to a first to a fifth comparative example against the MR element 5 of the embodiment. The sample 8 includes a spacer layer 50 having a structure shown in FIG. 10, instead of the spacer layer 24 of the samples 1 to 7. The structure of the spacer layer 50 is such that a plurality of nonmagnetic conductor phases 52 are randomly dispersed in an oxide semiconductor phase 51. The oxide semiconductor phase 51 is composed of ZnO while the nonmagnetic conductor phases 52 are composed of Cu. Hereinafter, a sample including the spacer layer 50 having the structure of FIG. 10 is called a Type (3) sample. The thickness of the spacer layer 50 is represented by T, like the spacer layer 24 of the samples 1 to 7.

Figure 11:
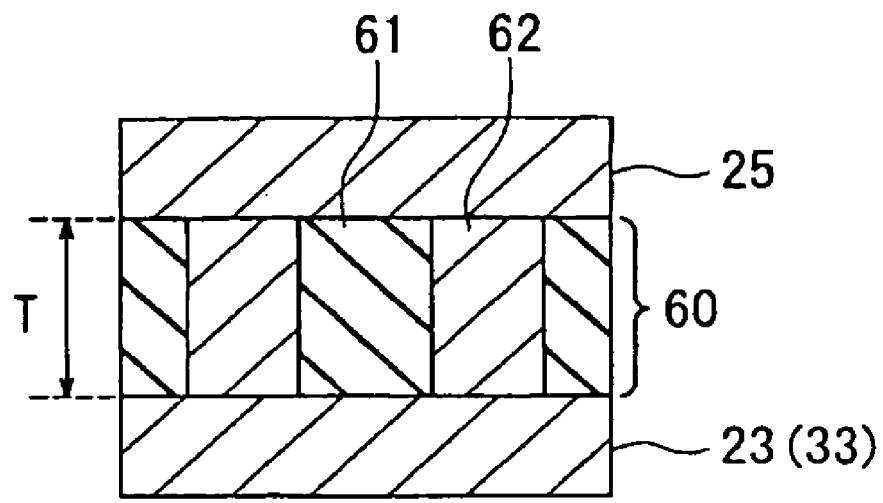
FIG. 11 is an explanatory view illustrating a spacer layer of an MR element of a second comparative example.

The sample 9 includes a spacer layer 60 having a structure shown in FIG. 11, instead of the spacer layer 24 of the samples 1 to 7. The spacer layer 60 is an oxide layer having a region 61 in which the resistance is relatively high and a region 62 in which the resistance is relatively low. The region 62 is column-shaped, and connects the inner layer 33 and the free layer 25 to each other. Hereinafter, a sample including the spacer layer 60 having the structure of FIG. 11 is called a Type (4) sample. The thickness of the spacer layer 60 is represented by T, like the spacer layer 24 of the samples 1 to 7.

The sample 10 has a film configuration of Type (2). However, in this sample the proportion of the nonmagnetic conductor phase 421 included in the second region 42 with respect to the entire spacer layer 24 exceeds 50 volume percent.

The sample 11 includes a spacer layer composed entirely of ZnO as an oxide semiconductor, instead of the spacer layer 24 of the samples 1 to 7. Such a sample is hereinafter called a Type (5) sample. The thickness of the spacer layer of the sample 11 is also represented by T, like the spacer layer 24 of the samples 1 to 7.

The sample 12 is provided with an aluminum oxide (Al$_2$O$_x$) film instead of the spacer layer 24 of the samples 1 to 7. Therefore, the sample 12 is not a CPP-GMR element but a TMR element.

The samples except the samples 8, 9 and 12 were each prepared by initially forming films to be the respective layers constituting each sample one by one to thereby obtain a stack of those films, and then subjecting the stack to heat treatment. The heat treatment was performed at a temperature of 250° C. for 5 hours in a vacuum of 1.0×10$^{-4}$ Pa or less.

The spacer layer 50 of the sample 8 was formed in the following manner. First, a film composed of ZnO and Cu was formed by sputtering ZnO and Cu simultaneously, using a target of ZnO and a target of Cu. Next, this film was heat-treated at a temperature of 250° C. for 5 hours to thereby form the spacer layer 50 having the structure in which a plurality of nonmagnetic conductor phases 52 each composed of Cu were randomly dispersed in the oxide semiconductor phase 51 composed of ZnO. In the sample 8 the layers other than the spacer layer 50 were formed by sputtering.

The spacer layer 60 of the sample 9 was formed through subjecting a metal layer formed by sputtering to an oxidation treatment, as disclosed in JP 2003-298143A. In the sample 9 the layers other than the spacer layer 60 were formed by sputtering, and no oxidation treatment was given.

The sample 12 was prepared by forming films to be the respective layers constituting the sample 12 one by one by sputtering.

When viewed from above, each sample has a shape of a rectangle that is 0.06 μm in width and 0.10 μm in length. This shape is approximately the same as that of the MR element 5 used for an actual read head. Note that the aforementioned "width" refers to a length taken in the direction of track width, while the "length" refers to a length taken in the direction perpendicular to the medium facing surface 20. The resistance-area product and MR ratio of each sample were measured using the direct-current four-probe method. The head noise of each sample was measured with a spectrum analyzer. The values of head noise measured were those obtained when the signal had a frequency of 20 MHz and a bandwidth of 1 Hz. The current density of each sample was determined by calculation based on the resistance-area product. The exchange coupling magnetic field of the pinned layer 23 of each sample was determined from the magnetoresistive curve. Tendencies made clear from the results of the experiment discussed below were approximately the same among the samples regardless of their shapes.

Table 2 below shows the results of the experiment. On Table 2 "Cu proportion (vol %)" means the proportion of Cu included in the spacer layer with respect to the entire spacer layer, which is the same as the proportion of the nonmagnetic conductor phase 421 included in the second region 42 with respect to the entire spacer layer 24 for the samples 1 to 7 and 10.

TABLE 2

| Sample | Type | T (nm) | Cu proportion (vol %) | Resistance-area product ($\Omega \cdot \mu m^2$) | MR ratio (%) | Head noise ($\mu Vrms/\sqrt{Hz}$) | Current density (A/cm$^2$) | Exchange coupling magnetic field (Oe) |
|---|---|---|---|---|---|---|---|---|
| 1 | (1) | 0.7 | 3 | 01.9 | 14.5 | $2.4 \times 10^{-4}$ | $2.2 \times 10^8$ | 1390 |
| 2 | (1) | 1.2 | 12 | 0.186 | 17 | $2.42 \times 10^{-4}$ | $1.1 \times 10^8$ | 1502 |
| 3 | (1) | 1.7 | 21 | 0.18 | 20 | $2.44 \times 10^{-4}$ | $7 \times 10^7$ | 1516 |
| 4 | (1) | 1.7 | 28 | 0.172 | 21 | $2.46 \times 10^{-4}$ | $7.6 \times 10^7$ | 1517 |
| 5 | (2) | 1.7 | 35 | 0.16 | 17.5 | $2.45 \times 10^{-4}$ | $8.2 \times 10^7$ | 1515 |
| 6 | (2) | 1.7 | 41 | 0.15 | 12.2 | $2.6 \times 10^{-4}$ | $9.3 \times 10^7$ | 1516 |
| 7 | (2) | 2 | 47 | 0.18 | 11 | $3.0 \times 10^{-4}$ | $2.3 \times 10^8$ | 1518 |
| 8 | (3) | 1.7 | 30 | 0.174 | 18 | $2.46 \times 10^{-4}$ | $8.2 \times 10^7$ | 1516 |
| 9 | (4) | 1.7 | — | 0.18 | 16 | $2.49 \times 10^{-4}$ | $8.5 \times 10^7$ | 1516 |
| 10 | (2) | 2.8 | 55 | 0.2 | 8 | $4.6 \times 10^{-4}$ | $2.3 \times 10^8$ | 1520 |
| 11 | (5) | 1 | 0 | 0.8 | 22 | $5.4 \times 10^{-4}$ | $2.3 \times 10^8$ | 1520 |
| 12 | TMR | 1 | 0 | 1.7 | 26 | $5.8 \times 10^{-4}$ | $5.88 \times 10^6$ | 1525 |

In the sample 1 the thickness of the spacer layer is smaller than 1 nm, while in the other samples it is equal to or greater than 1 nm. In the sample 1 the exchange coupling magnetic field of the pinned layer 23 is smaller than 1500 Oe, whereas in the other samples it is greater than 1500 Oe. The smaller exchange coupling magnetic field of the pinned layer 23 in the sample 1 is presumably due to the effect of spin torque on the magnetization of the pinned layer 23. To prevent a reduction in exchange coupling magnetic field of the pinned layer 23, it is preferred that the spacer layer 24 of the embodiment be 1 nm or greater in thickness.

If comparison is made between the samples 4 and 8 that are equal in thickness T of the spacer layer and similar in Cu proportion, the sample 4 is higher in MR ratio than the sample 8. The samples 8 and 9 are equal in thickness T of the spacer layer and similar in resistance-area product. However, the MR ratio of the sample 9 is lower than that of the sample 8, and is therefore lower than that of the sample 4. These results indicate that the structure of Type (1) can provide a higher MR ratio, compared with the structure of Type (3) or (4).

While the Cu proportions in the samples 1 to 7 are each lower than 50 volume percent, the Cu proportion in the sample 10 is higher than 50 volume percent. The head noise in the sample 10 is noticeably greater than that of each of the samples 1 to 7. This is presumably because, when the Cu proportion is higher than 50 volume percent, the effect of suppressing spin relaxation in the spacer layer 24 is not fully exhibited. To suppress head noise, in the embodiment it is preferred that the Cu proportion, that is, the proportion of the nonmagnetic conductor phase 421 included in the second region 42 with respect to the entire spacer layer 24, be equal to or lower than 50 volume percent. If comparison is made among the samples 3 to 6 in which the thickness T of the spacer layer 24 is 1.7 nm, it can be seen that there is a tendency of a reduction in resistance-area product and an increase in head noise with increasing Cu proportion.

In the case where the spacer layer does not include the nonmagnetic conductor phase 421 like the samples 11 and 12, the resistance-area product is too great and consequently the resistance of the entire MR element is too high.

The head noise caused by the MR element 5 is considered as shot noise that results from the occurrence of tunnel conduction of the spin-polarized electrons in the spacer layer 24. Here, the head noise Vs when the signal has a bandwidth of $\Delta f$ (Hz) is expressed by the following equation, where "e" represents the charge of an electron ($1.6 \times 10^{-19}$ coulomb), "I" represents the current (A) flowing through the MR element 5, "$\Delta f$" represents the bandwidth (Hz) of the signal, and "R" represents the resistance ($\Omega$) of the MR element 5.

$$Vs = R \times \sqrt{(2eI\Delta f)}$$

As mentioned previously, the values of head noise determined in the experiment were those obtained when the signal had a frequency of 20 MHz and a bandwidth $\Delta f$ of 1 Hz. The theoretically predicted value of head noise resulting from tunnel conduction is $4.7 \times 10^{-4}$ $\mu Vrms/\sqrt{Hz}$. The value of head noise in each of the samples 1 to 7 is smaller than $4.7 \times 10^{-4}$ $\mu Vrms/\sqrt{Hz}$. Therefore, in the MR element 5 of the embodiment, it seems that there occurs ohmic conduction, rather than tunnel conduction, in the spacer layer 24.

Disorder of the crystal structure in the spacer layer of each of Types (1) to (4) will now be considered. To obtain a higher MR ratio by suppressing spin relaxation in the spacer layer, it is preferred that the disorder of the crystal structure in the spacer layer be smaller, because in that case it is possible to suppress the spin relaxation resulting from scattering of spin-polarized electrons. In the spacer layer 60 of Type (4), the region 61 in which the resistance is relatively high and the region 62 in which the resistance is relatively low are formed by subjecting a metal layer to an oxidation treatment. Accordingly, in the spacer layer 60 of Type (4), a great change in composition occurs during the process of its formation, and as a result, the disorder of the crystal structure is enhanced. It is therefore difficult to increase the MR ratio in Type (4).

In contrast, the spacer layers of Types (1) to (3) do not undergo such a great change in composition or great disorder in crystal structure resulting therefrom as occurs in Type (4). Accordingly, in Types (1) to (3) it is possible to suppress spin relaxation in the spacer layer and to thereby attain a higher MR ratio.

Figure 12:
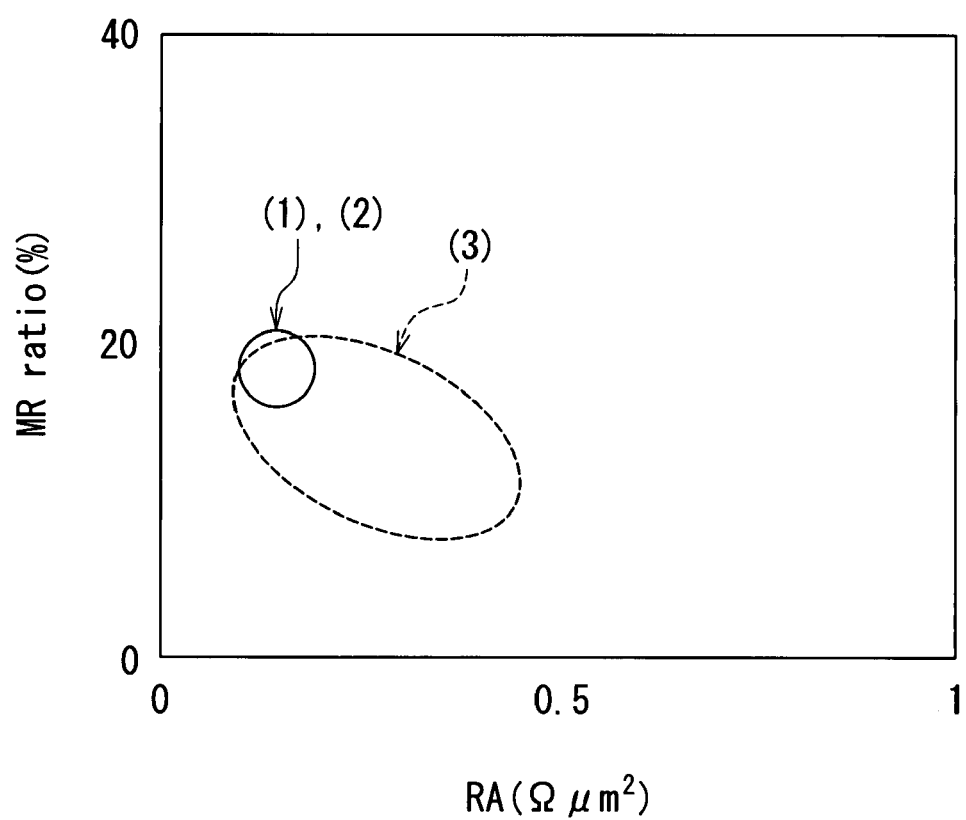
FIG. 12 is an explanatory view for explaining the effects of the MR element of the embodiment of the invention.

Current paths in the spacer layers of Types (1) to (3) will now be considered. In Type (3) a current flows from the pinned layer 23 to the free layer 25 or from the free layer 25 to the pinned layer 23 through the plurality of nonmagnetic conductor phases 52 in the spacer layer 50. In Type (3) the plurality of nonmagnetic conductor phases 52 are randomly dispersed in the oxide semiconductor phase 51. Therefore, if a plurality of MR elements of Type (3) are fabricated, a plurality of current paths in the spacer layer 50 are different among the MR elements. Accordingly, there are variations in resistance-area product and MR ratio in Type (3). In Types (1) and (2), in contrast, a plurality of current paths in the spacer layer 24 are not greatly different among the MR elements. Accordingly, in Types (1) and (2), variations in resistance-area product and MR ratio are smaller, compared with Type (3). FIG. 12 schematically illustrates ranges of variations in resistance-area product RA and MR ratio for Types (1) to (3). In FIG. 12 the range marked with (1), (2) indicates the range of variations in resistance-area product and MR ratio for Types (1) and (2), while the range marked with (3) indicates the range of variations in resistance-area product and MR ratio for Type (3). As can be seen from the foregoing considerations, the MR element of each of Types (1) and (2), that is, the MR element 5 of the embodiment, is capable of suppressing variations in resistance-area product and MR ratio.

Furthermore, from the results of the foregoing experiment, comparison between Types (1) and (2) in MR ratio indicates that Type (1) tends to provide an MR ratio higher than that of Type (2).

Figure 4:
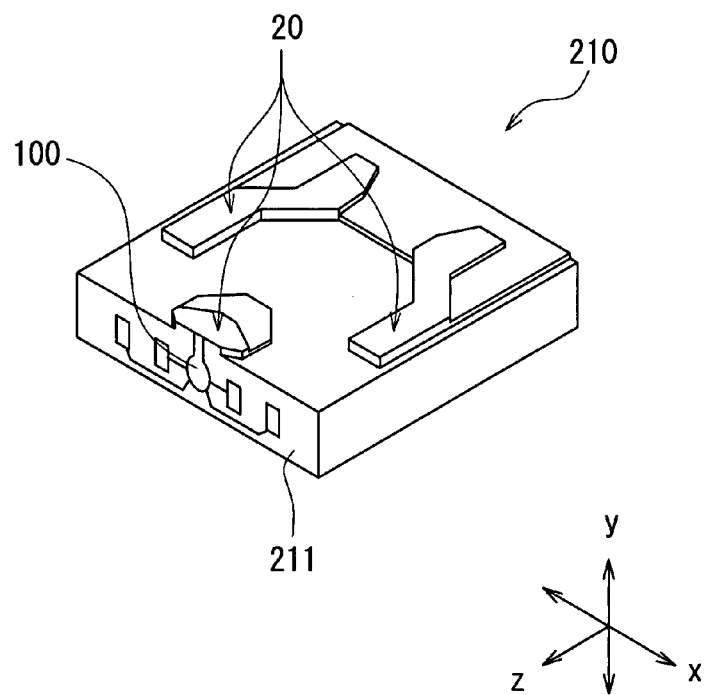
FIG. 4 is a perspective view illustrating a slider incorporated in a head gimbal assembly of the embodiment of the invention.

A head assembly and a magnetic disk drive of the embodiment will now be described. Reference is now made to FIG. 4 to describe a slider 210 incorporated in the head assembly. In the magnetic disk drive, the slider 210 is placed to face toward a magnetic disk platter that is a circular-plate-shaped recording medium to be driven to rotate. The slider 210 has a base body 211 made up mainly of the substrate 1 and the overcoat layer 17 of FIG. 2. The base body 211 is nearly hexahedron-shaped. One of the six surfaces of the base body 211 faces toward the magnetic disk platter. The medium facing surface 40 is formed in this one of the surfaces. When the magnetic disk platter rotates in the z direction of FIG. 4, an airflow passes between the magnetic disk platter and the slider 210, and a lift is thereby generated below the slider 210 in the y direction of FIG. 4 and exerted on the slider 210. The slider 210 flies over the surface of the magnetic disk platter by means of the lift. The x direction of FIG. 4 is across the tracks of the magnetic disk platter. The thin-film magnetic head 100 of the embodiment is formed near the air-outflow-side end (the end located at the lower left of FIG. 4) of the slider 210.

Figure 5:
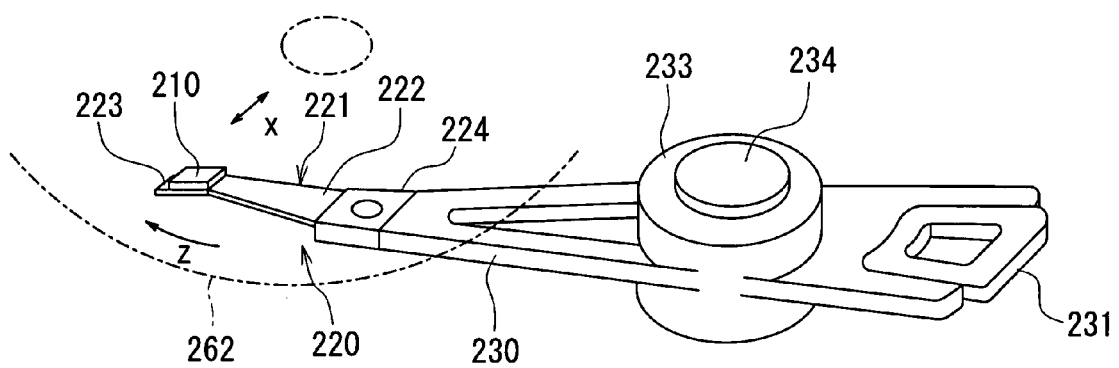
FIG. 5 is a perspective view illustrating a head arm assembly of the embodiment of the invention.

Reference is now made to FIG. 5 to describe the head assembly of the embodiment. The head assembly of the embodiment has the slider 210 and a supporter that flexibly supports the slider 210. Forms of this head assembly include a head gimbal assembly and a head arm assembly described below.

The head gimbal assembly 220 will be first described. The head gimbal assembly 220 has the slider 210 and a suspension 221 as the supporter that flexibly supports the slider 210. The suspension 221 has: a plate-spring-shaped load beam 222 made of stainless steel, for example; a flexure 223 to which the slider 210 is joined, the flexure 223 being located at an end of the load beam 222 and giving an appropriate degree of freedom to the slider 210; and a base plate 224 located at the other end of the load beam 222. The base plate 224 is attached to an arm 230 of an actuator for moving the slider 210 along the x direction across the tracks of the magnetic disk platter 262. The actuator has the arm 230 and a voice coil motor that drives the arm 230. A gimbal section for maintaining the orientation of the slider 210 is provided in the portion of the flexure 223 on which the slider 210 is mounted.

The head gimbal assembly 220 is attached to the arm 230 of the actuator. An assembly including the arm 230 and the head gimbal assembly 220 attached to the arm 230 is called a head arm assembly. An assembly including a carriage having a plurality of arms wherein the head gimbal assembly 220 is attached to each of the arms is called a head stack assembly.

FIG. 5 illustrates the head arm assembly of the embodiment. In the head arm assembly, the head gimbal assembly 220 is attached to an end of the arm 230. A coil 231 that is part of the voice coil motor is fixed to the other end of the arm 230. A bearing 233 is provided in the middle of the arm 230. The bearing 233 is attached to a shaft 234 that rotatably supports the arm 230.

Figure 6:
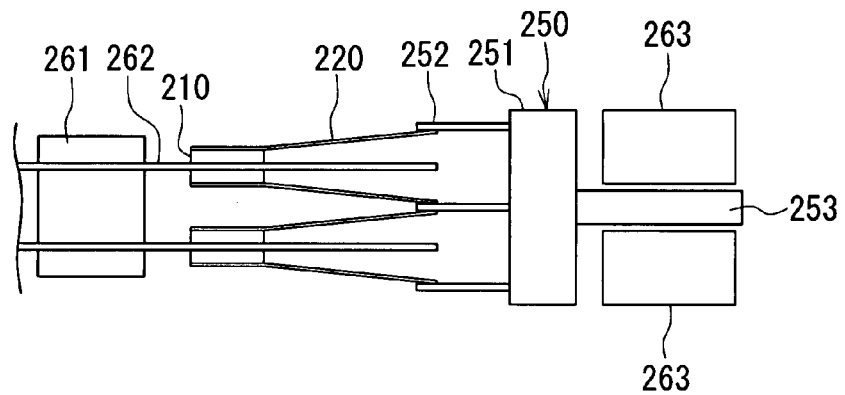
FIG. 6 is an explanatory view for illustrating the main part of a magnetic disk drive of the embodiment of the invention.
Figure 7:
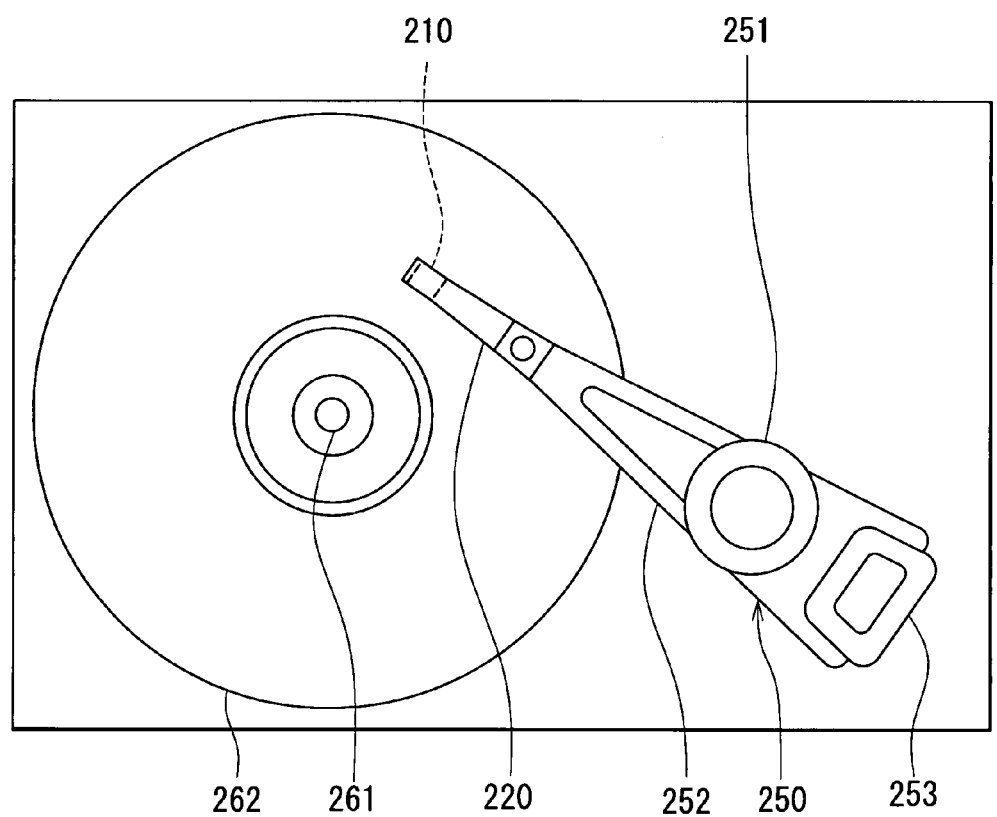
FIG. 7 is a top view of the magnetic disk drive of the embodiment of the invention.

Reference is now made to FIG. 6 and FIG. 7 to describe an example of the head stack assembly and the magnetic disk drive of the embodiment. FIG. 6 is an explanatory view illustrating the main part of the magnetic disk drive, and FIG. 7 is a top view of the magnetic disk drive. The head stack assembly 250 incorporates a carriage 251 having a plurality of arms 252. A plurality of head gimbal assemblies 220 are attached to the arms 252 such that the assemblies 220 are arranged in the vertical direction with spacing between respective adjacent ones. A coil 253 that is part of the voice coil motor is mounted on the carriage 251 on a side opposite to the arms 252. The head stack assembly 250 is installed in the magnetic disk drive. The magnetic disk drive includes a plurality of magnetic disk platters 262 mounted on a spindle motor 261. Two of the sliders 210 are allocated to each of the platters 262, such that the two sliders 210 are opposed to each other with each of the platters 262 disposed in between. The voice coil motor includes permanent magnets 263 disposed to be opposed to each other, the coil 253 of the head stack assembly 250 being placed between the magnets 263.

The actuator and the head stack assembly 250 except the sliders 210 correspond to the alignment device of the invention, and support the sliders 210 and align them with respect to the magnetic disk platters 262.

In the magnetic disk drive of the embodiment, the actuator moves the slider 210 across the tracks of the magnetic disk platter 262 and aligns the slider 210 with respect to the magnetic disk platter 262. The thin-film magnetic head incorporated in the slider 210 writes data on the magnetic disk platter 262 by using the write head, and reads data stored on the magnetic disk platter 262 by using the read head.

The head assembly and the magnetic disk drive of the embodiment exhibit effects similar to those of the thin-film magnetic head of the embodiment described previously.

The present invention is not limited to the foregoing embodiment but various modifications are possible. For example, the pinned layer 23 is not limited to a synthetic pinned layer. In addition, while the embodiment has been described with reference to a thin-film magnetic head having a structure in which the read head is formed on the base body and the write head is stacked on the read head, the read head and the write head may be stacked in the reverse order.

When the thin-film magnetic head is to be used only for read operations, the magnetic head may be configured to include the read head only.

It is apparent that the present invention can be carried out in various forms and modifications in the light of the foregoing descriptions. Accordingly, within the scope of the following claims and equivalents thereof, the present invention can be carried out in forms other than the foregoing most preferable embodiments.

What is claimed is:

1. A magnetoresistive element comprising:
   a free layer having a direction of magnetization that changes in response to an external magnetic field;
   a pinned layer having a fixed direction of magnetization; and
   a spacer layer disposed between the free layer and the pinned layer,
   wherein a current for detecting magnetic signals is fed in a direction intersecting a plane of each of the foregoing layers, and wherein:
   the spacer layer includes a first region, a second region and a third region that are each in the form of a layer and that are arranged in the direction intersecting the plane of each of the foregoing layers;

the second region is sandwiched between the first region and the third region;

the first region and the third region are each composed entirely of an oxide semiconductor; and the second region includes at least a nonmagnetic conductor phase, wherein the first region completely separates the second region and the pinned layer, the third region completely separates the second region and the free layer, the first region is sandwiched between the second region and the pinned layer and the third region is sandwiched between the second region and the free layer.

2. The magnetoresistive element according to claim 1, wherein:
the second region further includes an oxide semiconductor phase; and
a plurality of nonmagnetic conductor phases are scattered in the oxide semiconductor phase in the second region.

3. The magnetoresistive element according to claim 2, wherein the oxide semiconductor phase and the first and the third region are all composed of the same material.

4. The magnetoresistive element according to claim 1, wherein the second region is composed entirely of the nonmagnetic conductor phase.

5. The magnetoresistive element according to claim 1, wherein the second region has a thickness within a range of 0.1 to 1 nm.

6. The magnetoresistive element according to claim 1, wherein the first region and the third region each have a thickness within a range of 0.1 to 1.4 nm.

7. The magnetoresistive element according to claim 1, wherein the spacer layer has a thickness within a range of 1 to 3 nm.

8. The magnetoresistive element according to claim 1, wherein the proportion of the nonmagnetic conductor phase included in the second region with respect to the entire spacer layer is within a range of 1 to 50 volume percent.

9. A method of manufacturing a magnetoresistive element, the magnetoresistive element comprising:
a free layer having a direction of magnetization that changes in response to an external magnetic field;
a pinned layer having a fixed direction of magnetization; and
a spacer layer disposed between the free layer and the pinned layer, wherein:
the spacer layer includes a first region, a second region and a third region that are each in the form of a layer and that are arranged in a direction intersecting a plane of each of the foregoing layers;
the second region is sandwiched between the first region and the third region;
the first region and the third region are each composed entirely of an oxide semiconductor;
the second region includes at least a nonmagnetic conductor phase; and
a current for detecting magnetic signals is fed in the direction intersecting the plane of each of the foregoing layers,
the method comprising the steps of forming the pinned layer, forming the spacer layer, and forming the free layer,
wherein the step of forming the spacer layer includes the steps of:
forming a first oxide semiconductor layer;
forming a nonmagnetic conductor layer on the first oxide semiconductor layer;
forming a second oxide semiconductor layer on the nonmagnetic conductor layer; and performing heat treatment on the first oxide semiconductor layer, the nonmagnetic conductor layer and the second oxide semiconductor layer so that the first region is formed of the first oxide semiconductor layer, the third region is formed of the second oxide semiconductor layer, and the second region is formed of at least the nonmagnetic conductor layer, and wherein the first region completely separates the second region and the pinned layer, the third region completely separates the second region and the free layer, the first region is sandwiched between the second region and the pinned layer and the third region is sandwiched between the second region and the free layer.

10. The method according to claim 9, wherein:
the second region further includes an oxide semiconductor phase; and
as a result of the step of performing heat treatment, the second region is formed such that a plurality of nonmagnetic conductor phases are scattered in the oxide semiconductor phase.

11. A thin-film magnetic head comprising: a medium facing surface that faces toward a recording medium; a magnetoresistive element disposed near the medium facing surface to detect a signal magnetic field sent from the recording medium; and a pair of electrodes for feeding a current for detecting magnetic signals to the magnetoresistive element,
the magnetoresistive element comprising:
a free layer having a direction of magnetization that changes in response to an external magnetic field;
a pinned layer having a fixed direction of magnetization; and
a spacer layer disposed between the free layer and the pinned layer, wherein:
in the magnetoresistive element, the current for detecting magnetic signals is fed in a direction intersecting a plane of each of the foregoing layers;
the spacer layer includes a first region, a second region and a third region that are each in the form of a layer and that are arranged in the direction intersecting the plane of each of the foregoing layers;
the second region is sandwiched between the first region and the third region;
the first region and the third region are each composed entirely of an oxide semiconductor; and
the second region includes at least a nonmagnetic conductor phase, wherein the first region completely separates the second region and the pinned layer, the third region completely separates the second region and the free layer, the first region is sandwiched between the second region and the pinned layer and the third region is sandwiched between the second region and the free layer.

12. A head assembly comprising: a slider including a thin-film magnetic head and disposed to face toward a recording medium; and a supporter flexibly supporting the slider,
the thin-film magnetic head comprising: a medium facing surface that faces toward the recording medium; a magnetoresistive element disposed near the medium facing surface to detect a signal magnetic field sent from the recording medium; and a pair of electrodes for feeding a current for detecting magnetic signals to the magnetoresistive element,
the magnetoresistive element comprising:
a free layer having a direction of magnetization that changes in response to an external magnetic field;
a pinned layer having a fixed direction of magnetization; and a spacer layer disposed between the free layer and the pinned layer, wherein:

in the magnetoresistive element, the current for detecting magnetic signals is fed in a direction intersecting a plane of each of the foregoing layers;

the spacer layer includes a first region, a second region and a third region that are each in the form of a layer and that are arranged in the direction intersecting the plane of each of the foregoing layers;

the second region is sandwiched between the first region and the third region;

the first region and the third region are each composed entirely of an oxide semiconductor; and the second region includes at least a nonmagnetic conductor phase, wherein the first region completely separates the second region and the pinned layer, the third region completely separates the second region and the free layer, the first region is sandwiched between the second region and the pinned layer and the third region is sandwiched between the second region and the free layer.

13. A magnetic disk drive comprising: a slider including a thin-film magnetic head and disposed to face toward a recording medium that is driven to rotate; and an alignment device supporting the slider and aligning the slider with respect to the recording medium, the thin-film magnetic head comprising: a medium facing surface that faces toward the recording medium; a magnetoresistive element disposed near the medium facing surface to detect a signal magnetic field sent from the recording medium; and a pair of electrodes for feeding a current for detecting magnetic signals to the magnetoresistive element, the magnetoresistive element comprising:

a free layer having a direction of magnetization that changes in response to an external magnetic field;

a pinned layer having a fixed direction of magnetization; and a spacer layer disposed between the free layer and the pinned layer, wherein:

in the magnetoresistive element, the current for detecting magnetic signals is fed in a direction intersecting a plane of each of the foregoing layers;

the spacer layer includes a first region, a second region and a third region that are each in the form of a layer and that are arranged in the direction intersecting the plane of each of the foregoing layers;

the second region is sandwiched between the first region and the third region;

the first region and the third region are each composed entirely of an oxide semiconductor; and the second region includes at least a nonmagnetic conductor phase, wherein the first region completely separates the second region and the pinned layer, the third region completely separates the second region and the free layer, the first region is sandwiched between the second region and the pinned layer and the third region is sandwiched between the second region and the free layer.

* * * * *